(12) United States Patent
Lin et al.

(10) Patent No.: US 9,059,708 B2
(45) Date of Patent: Jun. 16, 2015

(54) SIGNAL GENERATING APPARATUS FOR GENERATING POWER-ON-RESET SIGNAL

(71) Applicant: Realtek Semiconductor Corp., Hsinchu (TW)

(72) Inventors: Chih-Cheng Lin, Taipei (TW); Jian-Ru Lin, Nantou County (TW); Che-Wei Chang, Taipei (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 14/331,313

(22) Filed: Jul. 15, 2014

(65) Prior Publication Data

US 2014/0320179 A1    Oct. 30, 2014

Related U.S. Application Data

(62) Division of application No. 13/409,091, filed on Feb. 29, 2012, now abandoned.

(30) Foreign Application Priority Data

Mar. 7, 2011   (TW) .............................. 100107506 A

(51) Int. Cl.
*H03L 7/00* (2006.01)
*H03K 17/22* (2006.01)

(52) U.S. Cl.
CPC .............. *H03K 17/22* (2013.01); *H03K 17/223* (2013.01)

(58) Field of Classification Search
USPC ....................... 327/76, 77, 142, 143, 198, 205
See application file for complete search history.

(56) References Cited

U.S. PATENT DOCUMENTS

| | | | |
|---|---|---|---|
| 6,437,614 B1 * | 8/2002 | Chen | 327/143 |
| 6,801,060 B2 | 10/2004 | Ikehashi et al. | |
| 6,943,617 B2 | 9/2005 | Tran et al. | |
| 7,504,870 B2 | 3/2009 | McClure et al. | |
| 7,542,259 B2 * | 6/2009 | Ho | 361/93.8 |
| 7,667,506 B2 * | 2/2010 | Mawet | 327/142 |
| 7,821,307 B2 | 10/2010 | Chellappa | |
| 8,080,989 B2 | 12/2011 | Jo | |

FOREIGN PATENT DOCUMENTS

| | | |
|---|---|---|
| CN | 1368641 A | 9/2002 |
| TW | 200928656 | 7/2009 |

OTHER PUBLICATIONS

Full English (machine) translation of CN1368641 (Published Sep. 11, 2002).

* cited by examiner

*Primary Examiner* — Long Nguyen
(74) *Attorney, Agent, or Firm* — McClure, Qualey & Rodack, LLP

(57) ABSTRACT

A signal generating apparatus, for generating a power-on-reset signal, including a bias circuit and a power-on-reset signal generating circuit is disclosed. The bias circuit is for generating an output bias voltage, and includes at least one bipolar junction transistor (BJT), wherein a base terminal of the BJT is coupled to a collector terminal of the BJT, and the output bias voltage is related to an emitter-to-base voltage of the BJT. The power-on-reset signal generating circuit is coupled to the bias circuit, and is for generating a duplicated voltage by duplicating the output bias voltage, wherein the power-on-reset signal is generated according to the duplicated voltage.

17 Claims, 9 Drawing Sheets

SIGNAL GENERATING APPARATUS FOR GENERATING POWER-ON-RESET SIGNAL

CROSS-REFERENCE TO RELATED APPLICATIONS

This Application is a divisional application of U.S. application Ser. No. 13/409,091, filed on Feb. 29, 2012, which is incorporated herein by reference in its entirety.

BACKGROUND OF THE INVENTION

1. Field of the Invention

The present invention relates to a signal generating apparatus, and more particularly, to a signal generating apparatus for generating a power-on-reset signal.

2. Description of the Prior Art

When typical electronic systems are being booted or reset, the supply voltages thereof require some time to climb to their normal levels. This means that, before the supply voltages reach their normal voltage levels, all signal processing related circuitry should be shut down in case of malfunction. Once the normal voltages are attained, a power-on-reset signal is required to notify the electronic systems to begin normal signal processing.

Please refer to FIG. 1, which is a diagram of a conventional power-on-reset signal generating apparatus 100. The power-on-reset signal generating apparatus 100 includes a bandgap circuit 110, a comparator 120 and a voltage dividing circuit 130. A reference voltage $V_{REF}$, which is generated by the bandgap circuit 110, is very insensitive to process, voltage and temperature (PVT) variations due to the circuit characteristics thereof. The reference voltage $V_{REF}$ is therefore very stable and suitable to be utilized as a comparison reference. The comparator 120 will receive the reference voltage $V_{REF}$ generated by the bandgap circuit 110 and a comparison voltage $V_{COMP}$ which is generated by the voltage dividing circuit 130 according to a supply voltage $V_{SUP}$, and compare the reference voltage $V_{REF}$ with the comparison voltage $V_{COMP}$ to generate a power-on-reset signal PORSB1. Please refer to FIG. 2, which is an ideal diagram of partial signals of the power-on-reset signal generating apparatus 100 shown in FIG. 1. When the supply voltage $V_{SUP}$ climbs to a certain voltage level, the comparison voltage $V_{COMP}$ also increases to a level higher than the reference voltage $V_{REF}$. At this moment, the comparator 120 will output the power-on-reset signal PORSB1 as "1", i.e. a high voltage level. However, since the supply voltage $V_{SUP}$ is also utilized to bias the bandgap circuit 110, when the supply voltage $V_{SUP}$ climbs up rapidly and the reference voltage $V_{REF}$ generated by the bandgap circuit 110 remains unstable, an erroneous comparison result may occur, which leads the power-on-reset signal PORSB1 to be changed to "1" prematurely. Please refer to FIG. 3, which is a diagram of partial erroneous signals that result from erroneous comparison by the power-on-reset signal generating apparatus 100 shown in FIG. 1. As shown in FIG. 3, during the interval when the supply voltage $V_{SUP}$ climbs rapidly, the comparator 120 may encounter misjudgment, leading to an erroneous power-on-reset signal PORSB1.

Please refer to FIG. 4, which is a diagram of another conventional power-on-reset signal generating apparatus 400. The power-on-reset signal generating apparatus 400 includes three diode-connected transistors M1. M2 and M3 coupled in series, a hysteresis circuit 410 (for example, a Schmitt trigger) and a buffer or invertor circuit 420. As the supply voltage $V_{SUP}$ increases, the transistors M1, M2 and M3 will also be switched to conduct currents, and a voltage $V_M$ is outputted simultaneously. As shown in FIG. 4, the voltage $V_M$ is a gate-source voltage of the transistor M1 plus a gate-source voltage of the transistor M2. When the voltage $V_M$ is larger than a threshold voltage of the hysteresis circuit 410, the power-on-reset signal PORSB2 outputted by the power-on-reset signal generating apparatus 400 will be changed to "1". Therefore, when the supply voltage $V_{SUP}$ climbs to an amount sufficient to switch on the transistors M1, M2 and M3, the power-on-reset signal PORSB2 will be changed to "1". The operations of the transistors M1, M2 and M3 are very susceptible to process or temperature variations, however, and the conventional power-on-reset signal generating apparatus 400 is not able to provide a stable power-on-reset signal as a result.

SUMMARY OF THE INVENTION

In light of this, the present invention provides a signal generating apparatus for generating a stable power-on-reset signal.

According to a first embodiment of the present invention, a signal generating apparatus for generating a power-on-reset signal is provided, which includes a bias circuit and a power-on-reset signal generating circuit. The bias circuit is for generating an output bias voltage, and includes at least one bipolar junction transistor (BJT), wherein a base terminal of the BJT is coupled to a collector terminal of the BJT, and the output bias voltage is related to an emitter-to-base voltage of the BJT. The power-on-reset signal generating circuit is coupled to the bias circuit, and is for generating a duplicated voltage by duplicating the output bias voltage, wherein the power-on-reset signal is generated according to the duplicated voltage.

According to a second embodiment of the present invention, a signal generating apparatus for generating a power-on-reset signal is provided. The signal generating apparatus comprises a bias circuit and a power-on-reset signal generating circuit. The bias circuit is used for generating an output bias voltage according to a bandgap bias circuit. The power-on-reset signal generating circuit is used for generating a first voltage according to the output bias voltage, wherein the power-on-reset signal is generated according to the first voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
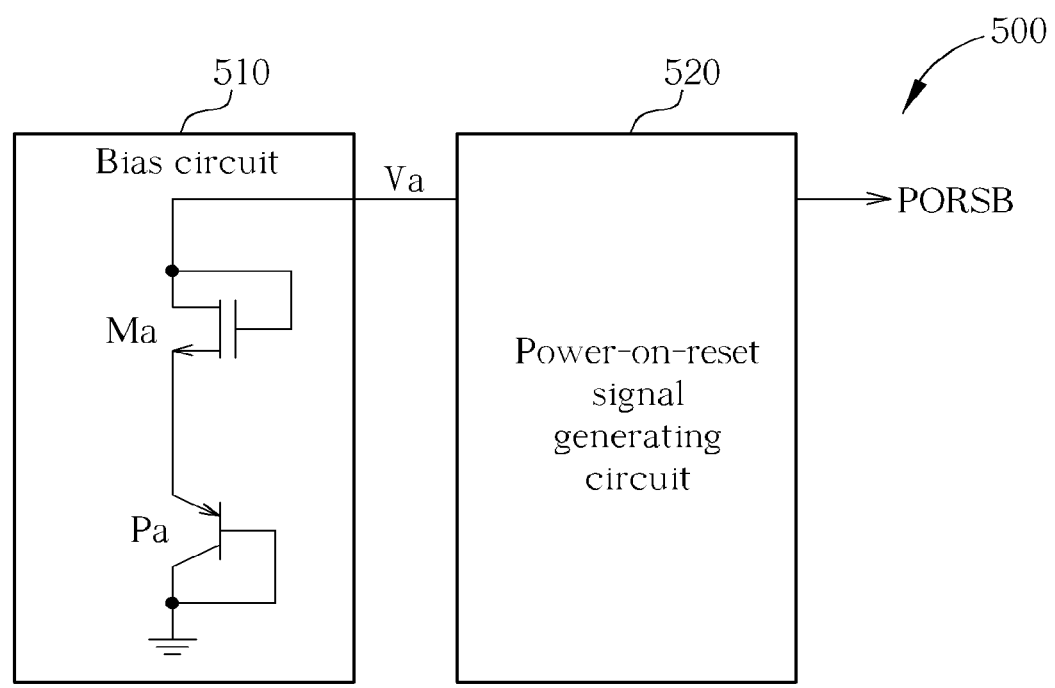
FIG. 5 is a diagram of a signal generating apparatus according to an embodiment of the present invention.

Please refer to FIG. 5, which is a diagram of a signal generating apparatus 500 according to an embodiment of the present invention. The signal generating apparatus 500 includes a bias circuit 510 and a power-on-reset signal generating circuit 520. In this embodiment, the bias circuit 510 includes (but is not limited to) a PNP bipolar junction transistor (BJT) Pa and a metal-oxide-semiconductor (MOS) transistor Ma, wherein a base terminal of the PNP BJT Pa is coupled to a collector thereof, and a gate terminal of the MOS transistor Ma is coupled to a drain terminal thereof to form a diode-connected transistor. The bias circuit 510 is for generating an output bias voltage Va as shown in FIG. 5. In this embodiment, the output bias voltage Va is formed by an emitter-base voltage $V_{EB}$ of the BJT Pa plus a gate-source voltage $V_{GS}$ of the MOS transistor Ma. In addition, the power-on-reset signal generating circuit 520 generates a duplicated voltage by duplicating the output bias voltage Va, and generates a power-on-reset signal PORSB according to the duplicated voltage.

Figure 6:
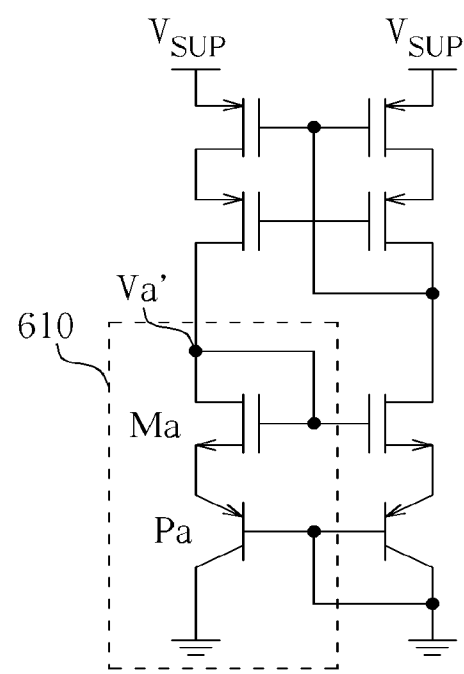
FIG. 6 is a diagram of a bandgap circuit for generating a bandgap bias according to an embodiment of the present invention.

Please refer to FIG. 6 in conjunction with FIG. 5. FIG. 6 is a diagram of a bandgap circuit 600 for generating a bandgap bias according to an embodiment of the present invention. The bandgap circuit 600 includes a bandgap bias unit 610; as shown in FIG. 5 and FIG. 6, the bandgap bias unit 610 has substantially the same circuit structure as the bias circuit 510, i.e. they both include a BJT Pa and a MOS transistor Ma and are both coupled substantially in the same way. A bias voltage Va' outputted by the bandgap bias unit 610 will be substantially identical to the output bias voltage Va outputted by the bias circuit 510, which includes an emitter-base voltage $V_{EB}$ of the BJT Pa and a gate-source voltage $V_{GS}$ of the MOS transistor Ma. Therefore, the bias circuit 510 is capable of tracking the bias voltage Va' of the bandgap bias unit 610. When the operation environment (e.g., manufacture process, temperature, etc.) changes, the output bias Va of the bias circuit 510 can still be maintained at a fixed voltage. Please note that the bias circuit 510 is utilized to track the bias voltage Va' of the bandgap bias unit 610 comprising a BJT and a MOS, and this invention doesn't limit the bias circuit to this embodiment only.

Figure 7:
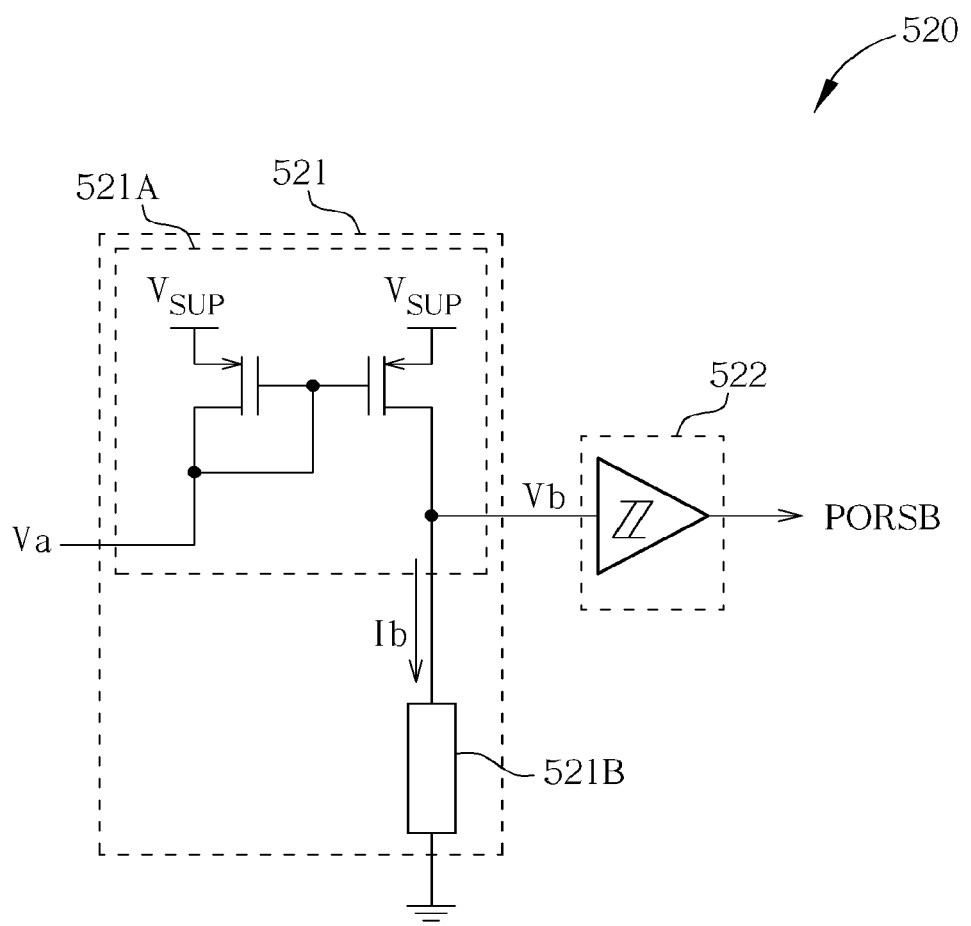
FIG. 7 is a diagram of a power-on-reset signal generating circuit according to an embodiment of the present invention.

Please refer to FIG. 7, which is a diagram of the power-on-reset signal generating circuit 520 according to an embodiment of the present invention. The power-on-reset signal generating circuit 520 includes a duplication unit 521 and a hysteresis unit 522. The duplication unit 521 includes a current mirror 521A and a loading element 521B. In this embodiment, the loading element 521B is a resistor; however, the loading element 521B can also be implemented by a transistor or any other circuit element in other embodiments. The current mirror 521A will receive the output voltage Va outputted by the bias circuit 510 and duplicate a current flowing through the bias circuit 510 to generate a duplication current Ib. After the duplication current Ib flows through the loading element 521B, the duplication voltage Vb is generated accordingly. After receiving the duplication voltage Vb, the hysteresis unit 522 will generate a power-on-reset signal PORSB according to the duplication voltage Vb. As the supply voltage $V_{SUP}$ rises up, the BJT Pa and the MOS transistor Ma within the bias circuit 510 are enabled accordingly to conduct currents and raise the output voltage Va of the bias circuit 510; therefore, the duplication voltage Vb also rises as the output voltage Va. When the duplication voltage Vb is raised to a threshold voltage of the hysteresis circuit 522, the power-on-reset signal PORSB of the signal generating apparatus 500 is changed to become "1", i.e. a high voltage level. Since the duplication unit 521 is designed by tracking a bias voltage of the bandgap circuit 600, the output voltage Va of the duplication unit 521 is substantially identical to an output voltage of the bandgap circuit 600, and the power-on-reset signal PORSB outputted by the signal generating apparatus 500 is very insensitive to environment variation. In addition, since the power-on-reset signal PORSB outputted by the signal generating apparatus 500 is not a comparison result of the supply voltage $V_{SUP}$, even during the rapid rising process of the supply voltage $V_{SUP}$, the power-on-reset signal PORSB will not be raised to "1" prematurely due to an erroneous comparison result. Please note that the circuit introduced above is merely an embodiment of the present invention and is not supposed to be a limitation of the present invention. For example, the hysteresis unit 522 is an optional element; in other embodiments the signal generating apparatus 500 can also omit the hysteresis unit 522 and use the duplication voltage Va as the power-on-reset signal PORSB directly. In other words, any signal generating apparatus utilizing the bias circuit shown in FIG. 6 and the duplication unit 521 shown in FIG. 7 falls within the scope of the present invention.

Figure 1:
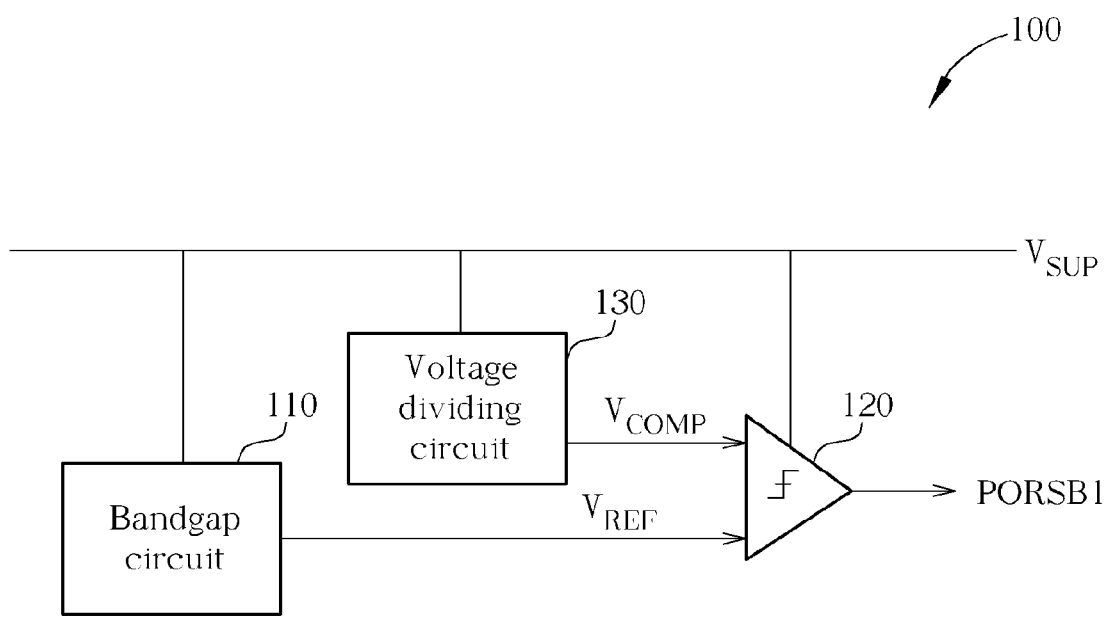
FIG. 1 is a diagram of a conventional power-on-reset signal generating apparatus.
Figure 2:
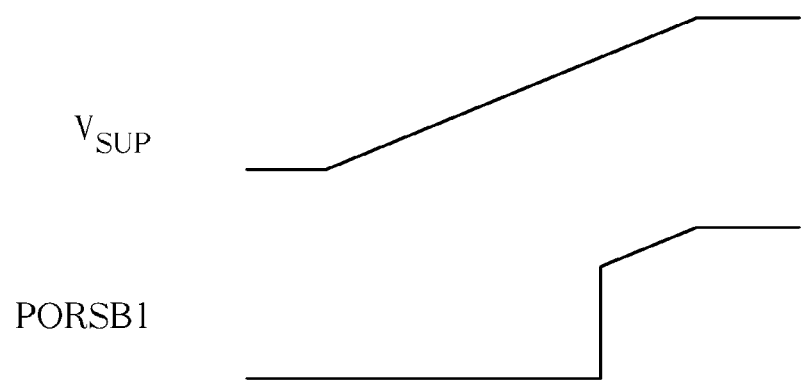
FIG. 2 is an ideal diagram of partial signals of the power-on-reset signal generating apparatus shown in FIG. 1.
Figure 3:
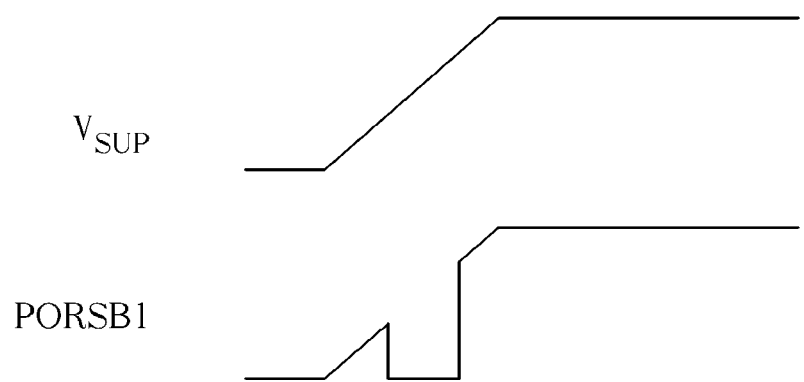
FIG. 3 is a diagram of partial erroneous signals resulting from erroneous comparison of the power-on-reset signal generating apparatus shown in FIG. 1.
Figure 4:
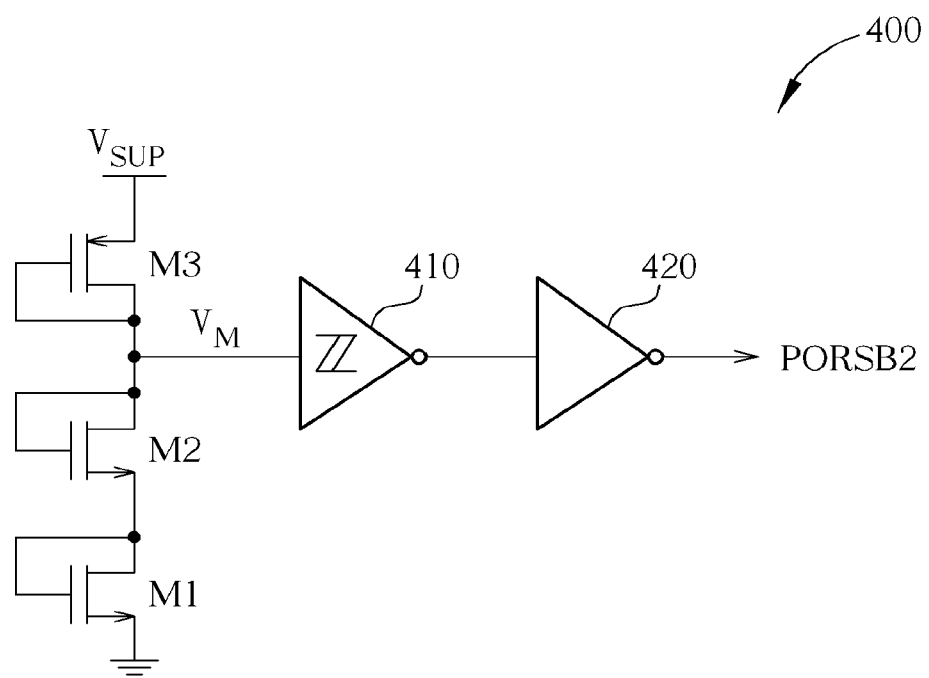
FIG. 4 is a diagram of another conventional power-on-reset signal generating apparatus.
Figure 8:
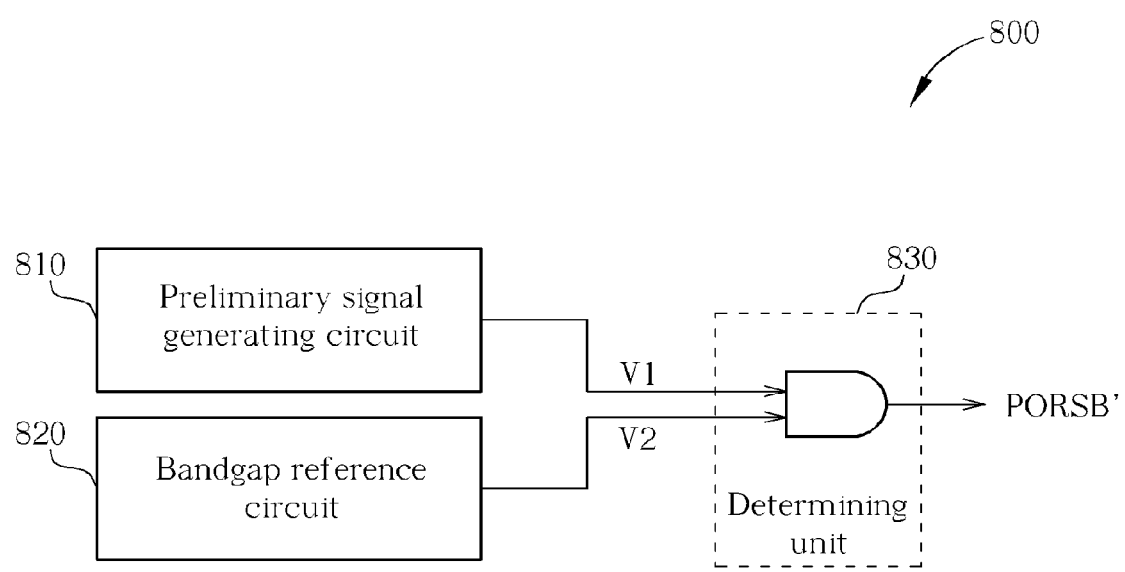
FIG. 8 is a diagram of a signal generating apparatus according to another embodiment of the present invention.
Figure 9:
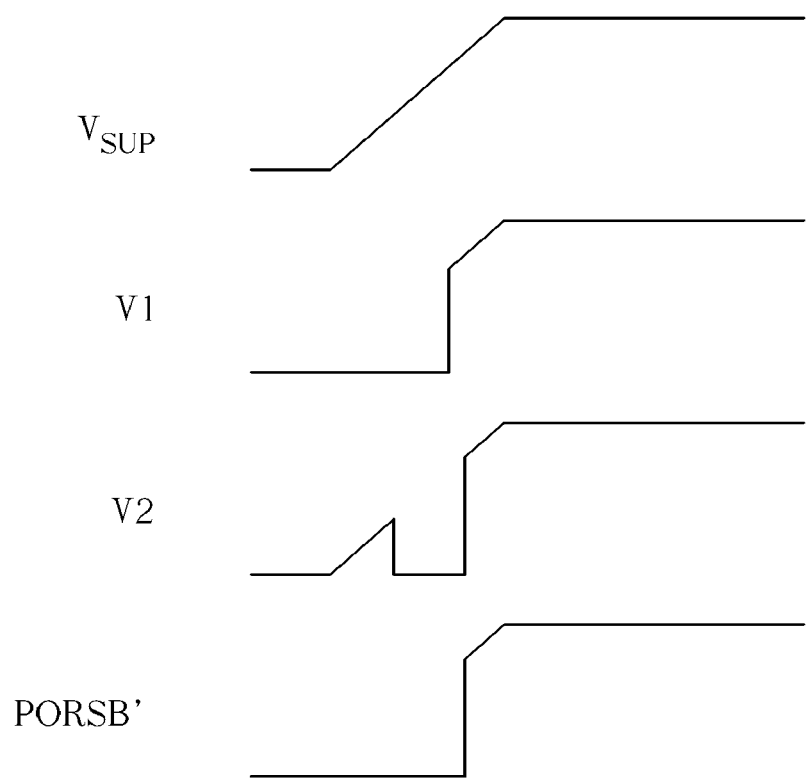
FIG. 9 is a diagram of partial signals within the signal generating apparatus shown in FIG. 8 according to an embodiment of the present invention.

Please refer to FIG. 8, which is a diagram of a signal generating apparatus 800 according to another embodiment of the present invention. The signal generating apparatus 800 includes a preliminary signal generating circuit 810 for generating a first reference voltage V1, a bandgap reference circuit 820 for generating a second reference voltage V2, and a determination unit 830. The function and the structure of the preliminary signal generating circuit 810 can be identical to the signal generating apparatus 500 shown in FIG. 5. The bandgap reference circuit 820 can also be identical to the bandgap circuit 110 or the power-on-reset signal generating apparatus 100 shown in FIG. 1, and further descriptions are omitted here for brevity. In this embodiment, the determination unit 830 will receive the second reference voltage V2 and the first reference voltage V1, and generate a power-on-reset signal PORSB' according to the second reference voltage V2 and the first reference voltage V1. For example, the determination unit 830 can be implemented with an AND gate, and the determination unit 830 will apply an intersection for the second reference voltage V2 and the first reference voltage V1 to derive the power-on-reset signal PORSB'. Please refer to FIG. 9 in conjunction with FIG. 8. FIG. 9 is a diagram of partial signals within the signal generating apparatus 800 according to an embodiment of the present invention. In FIG. 9, when the supply voltage $V_{SUP}$ rises up, the second reference voltage V2 generated by the bandgap reference circuit 820 will generate an erroneous comparison result during the comparing process, whereas the first reference voltage V1 generated by the preliminary signal generating circuit 810 does not produce such errors resulting from comparison. The bandgap reference circuit 820 is operated based on bandgap energy, so the second reference voltage V2 generated thereof will be extremely stable and insusceptible to external environments; nevertheless, although the first reference voltage V1 generated by the preliminary signal generating circuit 810 is capable of substantially tracking a bias voltage within the bandgap reference circuit 820, it is not as stable as the second reference voltage V2 generated by the bandgap reference circuit 820. The power-on-reset signal PORSB', which combines the first reference voltage V1 and the second reference voltage V2 via the determination unit 830, can provide the stability and correctness of both simultaneously, and output the correct power-on-reset signal PORSB' while the supply voltage $V_{SUP}$ rises up rapidly. In addition, if the bandgap reference circuit 820 is designed to further include the voltage dividing circuit 130 etc. as the power-on-reset signal generating apparatus 100 shown in FIG. 1, it can operate in response to the supply voltage variation more directly.

To summarize, the present invention provides a signal generating apparatus for generating a power-on-reset signal, wherein when the supply voltage rises up rapidly, the power-on-reset signal provided by the signal generating apparatus will not be active at incorrect timings due to erroneous comparison. In addition, since the present invention is capable of tracking an output bias of a bandgap circuit, the external environment has little influence on the signal generating apparatus, and therefore the power-on-reset signal generated thereof can make circuits within an electrical system operate correctly and stably.

Those skilled in the art will readily observe that numerous modifications and alterations of the device and method may be made while retaining the teachings of the invention.

What is claimed is:

1. A signal generating apparatus for generating a power-on-reset signal, comprising:
    a bias circuit for generating an output bias voltage, wherein the bias circuit comprises at least one bipolar junction transistor (BJT), a base terminal of the BJT is coupled to a collector terminal of the BJT, and the output bias voltage is related to an emitter-to-base voltage of the BJT;
    a power-on-reset signal generating circuit comprising a duplication unit and a hysteresis unit, the duplication unit configured to generate a first voltage by substantially duplicating the output bias voltage, the hysteresis unit configured to receive the first voltage and generate a second voltage based on the first voltage;
    a bandgap reference circuit, for generating a third voltage; and
    a determination unit, coupled to the power-on-reset signal generating circuit and the bandgap reference circuit, the determination unit generating the power-on-reset signal according to the second voltage and the third voltage.

2. The signal generating apparatus of claim 1, wherein the bandgap reference circuit further comprises:
    a bandgap circuit for generating a reference voltage according to bandgap energy such that the reference voltage is insusceptible to environmental variation;
    a voltage dividing circuit, for generating a comparison voltage according to a divided voltage of a supply voltage; and
    a comparator, for generating the third voltage by comparing the reference voltage with the comparison voltage;
    wherein the determination unit receives the third voltage and the second voltage as inputs.

3. The signal generating apparatus of claim 1, wherein the determination unit applies a logical AND operation to the second voltage and the third voltage to output the power-on-reset signal.

4. The signal generating apparatus of claim 1, wherein the duplication unit comprises a loading element and a current mirror, the current mirror being coupled to the loading element and the bias circuit for receiving the output bias voltage.

5. The signal generating apparatus of claim 4, wherein the current mirror comprises at least one transistor coupled to a supply voltage, the current mirror being configured to duplicate a current flowing via the bias circuit to generate a duplication current flowing via the loading element, wherein the first voltage is related to the duplication current and the loading element.

6. The signal generating apparatus of claim 5, wherein the current mirror comprises a pair of transistors coupled together via gate terminals of the pair of transistors.

7. The signal generating apparatus of claim 6, wherein the gate terminals are coupled directly to the output bias voltage.

8. The signal generating apparatus of claim 7, wherein source terminals of the transistor pair are coupled directly to the supply voltage.

9. The signal generating apparatus of claim 8, wherein the gate terminals are coupled to a drain terminal of one transistor of the pair of transistors.

10. The signal generating apparatus of claim 9, wherein a drain terminal of the other transistor of the pair of transistors outputs the first voltage.

11. A signal generating apparatus for generating a power-on-reset signal, comprising:
    a bias circuit for generating an output bias voltage, wherein the bias circuit comprises at least one bipolar junction transistor (BJT), a base terminal of the BJT is coupled to a collector terminal of the BJT, and the output bias voltage is related to an emitter-to-base voltage of the BJT;
    a power-on-reset signal generating circuit comprising a duplication unit, the duplication unit configured to generate a first voltage by substantially duplicating the output bias voltage, the power-on-reset signal generating circuit configured to generate a second voltage based on the first voltage;
    a bandgap reference circuit configured to generate third voltage; and
    a determination unit configured to receive the second voltage and the third voltage, the determination unit being further configured to apply a logical AND operation to the second voltage and the third voltage to output the power-on-reset signal.

12. The signal generating apparatus of claim 11, wherein the bandgap reference circuit further comprises:
    a bandgap circuit for generating a bandgap reference voltage according to a bandgap energy;
    a voltage dividing circuit, for generating a comparison voltage according to a divided voltage of a supply voltage; and
    a comparator, for generating the third voltage by comparing the bandgap reference voltage with the comparison voltage.

13. The signal generating apparatus of claim 11, wherein the duplication unit comprises a loading element and a current mirror, the current mirror being coupled to the loading element and the bias circuit for receiving the output bias voltage, the current mirror comprising at least one transistor coupled to a supply voltage,
    wherein the current mirror is configured to duplicate a current flowing via the bias circuit to generate a duplication current flowing via the loading element,
    wherein the first voltage is related to the duplication current and the loading element,
    wherein the current mirror comprises a pair of transistors coupled together via gate terminals of the pair of transistors.

14. The signal generating apparatus of claim 13, wherein the gate terminals are coupled directly to the output bias voltage.

15. The signal generating apparatus of claim 14, wherein source terminals of the pair of transistors are coupled directly to the supply voltage.

16. The signal generating apparatus of claim 15, wherein the gate terminals are coupled to a drain terminal of one transistor of the pair of transistors.

17. A signal generating apparatus for generating a power-on-reset signal, comprising:
- a bias circuit comprising a bipolar junction transistor (BJT), the bias circuit being configured to generate an output bias voltage based on an emitter-to-base voltage of the BJT;
- a power-on-reset signal generating circuit comprising a duplication unit configured to generate a first voltage by substantially duplicating the output bias voltage, the power-on-reset signal generating circuit configured to generate a second voltage based on the first voltage;
- a bandgap reference circuit configured to generate a third voltage; and
- a determination unit configured to output the power-on-reset signal based on the second voltage and the third voltage.

\* \* \* \* \*